United States Patent
Yuen et al.

(10) Patent No.: US 6,242,976 B1
(45) Date of Patent: Jun. 5, 2001

(54) LOW COST LINEARIZED CHANNEL AMPLIFIER FOR USE WITH HIGH POWER AMPLIFIERS

(75) Inventors: Cindy Yuen, Saratoga; Steve S. Yang, Newark; Kevin Smith, Sunnyvale; Mark Adams, Santa Clara; David Ethridge, San Jose, all of CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/328,748

(22) Filed: Jun. 9, 1999

(51) Int. Cl.[7] ............................... H03G 3/20; H03G 3/10
(52) U.S. Cl. ...................... 330/129; 330/289; 330/284
(58) Field of Search ................................. 330/129, 134, 330/149, 284, 289

(56) References Cited

U.S. PATENT DOCUMENTS

| | | | |
|---|---|---|---|
| 4,554,511 | * 11/1985 | Braun | 330/129 |
| 5,862,460 | * 1/1999 | Rich | 330/284 |
| 5,977,831 | * 11/1999 | Davis | 330/129 |
| 6,118,336 | * 9/2000 | Pullen et al. | 330/10 |

* cited by examiner

Primary Examiner—Benny Lee
Assistant Examiner—Khanh V. Nguyen
(74) Attorney, Agent, or Firm—Kenneth W. Float

(57) ABSTRACT

A linearized channel amplifier comprising a linear channel amplifier circuit 20 and a nonlinear linearizer circuit located immediately before a high power amplifier. A common control circuit controls the linear channel amplifier circuit and the nonlinear linearizer circuit. The linearized channel amplifier functions as a driver amplifier and improves the linearity and efficiency performance of the high power amplifier across a desired frequency bandwidth. The linearized channel amplifier employs low cost temperature compensation circuits in an interface circuit and a temperature compensation network circuit, and uses a novel methodology to provide for command and control functions that includes a measurement, analytical calculation and setting process. An external personality plug may be to set the performance of the channel amplifier and linearizer.

20 Claims, 2 Drawing Sheets

LOW COST LINEARIZED CHANNEL AMPLIFIER FOR USE WITH HIGH POWER AMPLIFIERS

BACKGROUND

The present invention relates generally to linearized channel amplifiers, and more particularly, to an improved low cost linearized channel amplifier designed for use with high power amplifiers.

Lockheed Martin Corporation has developed a linearized channel amplifier that is described in a paper entitled "Linearized Traveling Wave Tube Amplifiers for Space", by Shabbir Moochalla, published in 1998 IEEE MTT-S International Microwave Symposium & Exhibition. The Lockheed Martin linearized channel amplifier uses a passive FET technology developed by Lockheed Martin that is used to implement the linearizer circuit.

Nippon Electric Corporation has developed a linearized channel amplifier that is described in a document entitled "INTELSAT-VII Linearizer for Ku-Band TWTA". The NEC linearized channel amplifier uses an FET amplifier as the nonlinear element for the linearizer.

Alcatel has developed a linearized channel amplifier that is described in a data sheet published by the company. The Alcatel linearized channel amplifier uses a MMIC amplifier as the nonlinear element for the linearizer.

Bosch Telecom, GmbH has developed a linearized channel amplifier that is described in a data sheet published by the company. The Bosch linearized channel amplifier uses a passive diode as the nonlinear element for the linearizer.

All of the four above-mentioned designs are different from the design approach used in the present invention. It would be desirable to have a low cost linearized channel amplifier designed for use with high power amplifiers that improves upon currently available approaches, such as those mentioned above.

SUMMARY OF THE INVENTION

The present invention provides for low cost linearized channel amplifier comprising a linear channel amplifier circuit and a nonlinear linearizer circuit located immediately before a high power amplifier. A common control circuit controls the linear channel amplifier and nonlinear linearizer circuits. The linearized channel amplifier functions as a driver amplifier and also improves the linearity and efficiency performance of the high power amplifier across a desired frequency bandwidth.

The linearized channel amplifier of the present invention may be used in any frequency band including L, C, X, Ku, K, Ka, Q, V, and W-Band, for example. The linearized channel amplifier may also be used with any high power amplifier including traveling wave tube amplifiers (TWTA) and solid state power amplifiers (SSPA).

The novelty of the present linearized channel amplifier is a result of a number of factors. The linearizer circuit is based on concepts developed by the assignee of the present invention disclosed in U.S. Pat. No. 5,789,978, entitled "Ku-Band Linearizer Bridge". The linearized channel amplifier uses a simple low cost temperature compensation design approach. Also, the linearized channel amplifier uses a novel methodology to provide for all command and control functions that includes a measurement, analytical calculation and setting process. The conventional time-consuming tune and test process over temperature is thus eliminated. This translates to lower production costs.

The linearized channel amplifier may use an external personality plug to set the performance of the channel amplifier and linearizer. The use of the external personality plug makes the design extremely flexible for setting linearized channel amplifier performance to match to the high power amplifier performance. Alternatively, the functions of the external personality plug may be implemented in the control circuit.

Various advantages are provided by the linearized channel amplifier. A preferred embodiment of the linearized channel amplifier includes a channel amplifier and a linearizer integrated into one single package to save size, weight, interface complexity and cost. The interface of the linearized channel amplifier may transmit and receive either pulse commands or serial interface adapter (SIA) commands.

A reduced-to-practice embodiment of the channel amplifier provides both fixed gain operation (31 steps with 1 dB step) and ALC mode operation (31 steps with 0.5 dB step) over more than a 40 dB dynamic range. The channel amplifier has the ability to telemetry fixed gain/ALC mode (TTL) and output power (analog) status. The linearizer has independent controls of gain and phase over input power level and across wide bandwidth. The design of the linearizer is flexible to compensate power amplifiers (TWTA or SSPA) with any variation of gain and phase performance.

The linearizer has both active and bypass modes. A reduced-to-practice embodiment of the linearizer has a commandable output power range of 7.5 dB with 0.5 dB step size and an output level limiting capability. The linearizer has the ability to telemetry linearizer active/bypass mode (TTL) and output level (analog) status. The linearizer may be realized on a compact size, single alumina substrate using PIN and Schottky diodes or using MMIC chips to minimize production cost. Reduced-to-practice embodiments of both the channel amplifier and the linearizer may be temperature compensated to within less than +/−0.25 dB using a novel temperature compensation circuit.

BRIEF DESCRIPTION OF THE DRAWINGS

The various features and advantages of the present invention may be more readily understood with reference to the following detailed description taken in conjunction with the accompanying drawing, wherein like reference numerals designate like structural element, and in which.

DETAILED DESCRIPTION

Figure 1:
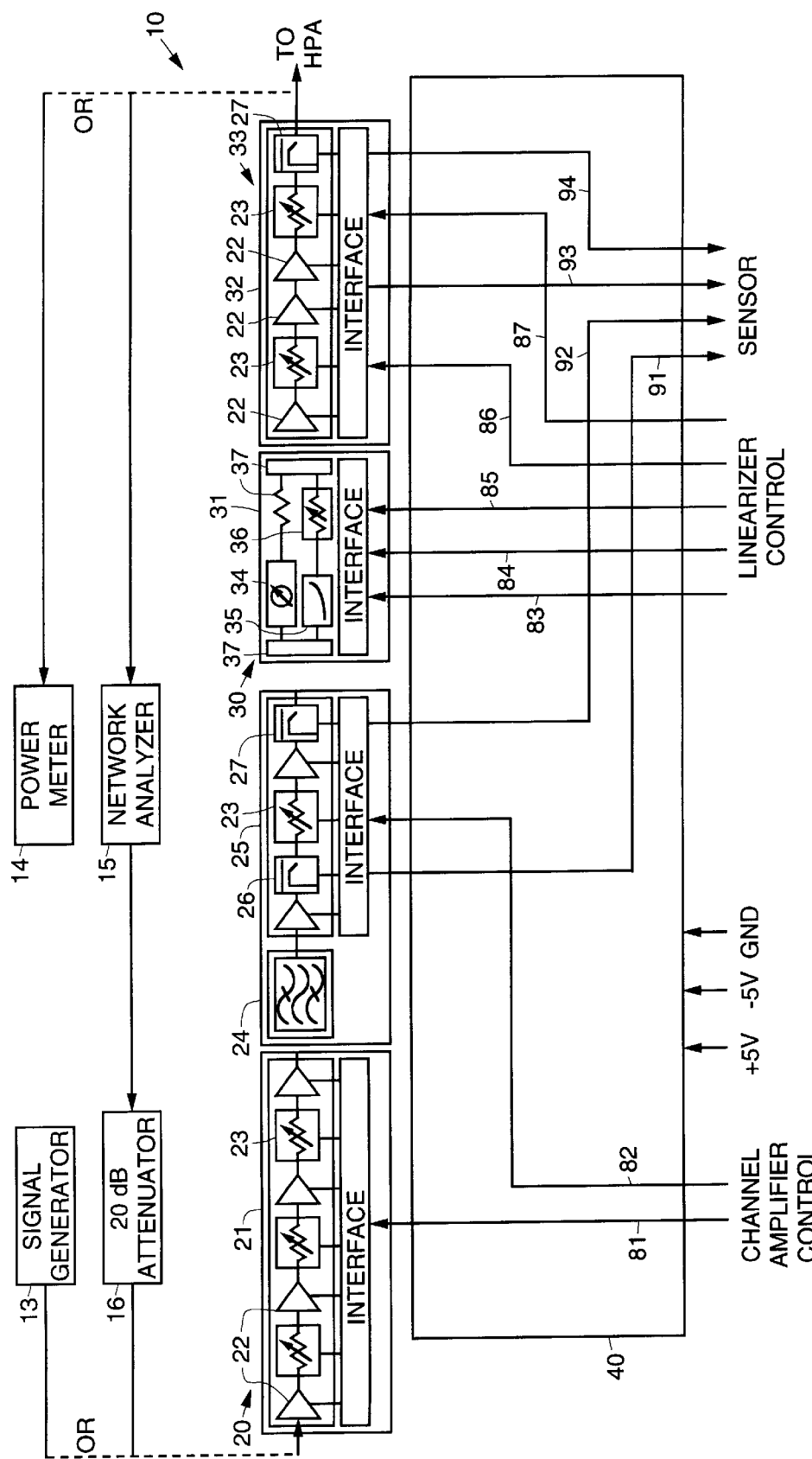
FIG. 1 is a block diagram that illustrates an exemplary linearized channel amplifier in accordance with the principles of the present invention.

Referring to the drawing figures, FIG. 1 shows a block diagram of an exemplary linearized channel amplifier 10 in accordance with the principles of the present invention. The linearized channel amplifier 10 is comprised of three major sections, including a channel amplifier 20 that feeds a linearizer 30, and a shared control circuit 40 coupled to the channel amplifier 20 and linearizer 30. The linearized channel amplifier 10 is located immediately before a high power amplifier (HPA).

The exemplary channel amplifier 20 comprises a first commandable gain block 21, a bandpass filter 24, a second commandable gain block 25 comprising a detector/coupler 26 that provides for commandable automatic gain level control (ALC) operation, and a detector/coupler 27 that provides for output level telemetry. The first commandable gain block 21 comprises a MMIC amplifier 22 and attenuator 23 that provide 30 dB range in 1 dB step size in a reduced to practice embodiment of the channel amplifier 20. The attenuator 23 in the second commandable gain block 25 provides for a 15 dB power range in 0.5 dB step size in a reduced to practice embodiment of the channel amplifier 20.

The command functions of channel amplifier 20 include fixed gain (FG) and automatic gain level control (ALC) mode selection, and commandable gain or power level. The telemetry capabilities of channel amplifier 20 include fixed gain or automatic gain level control mode and output power level status. A reduced to practice embodiment of the channel amplifier 20 provides up to 65 dB of gain, and may be operated in either fixed gain or automatic gain level control mode. The command functions are controlled by the control circuit 40 which are described in detail below.

The exemplary linearizer 30 comprises an integrated linearizer bridge 31 and a third commandable gain block 32 comprising a limiting amplifier 33 (an amplifier 22 and an attenuator 23) and the detector/coupler 27 that provides for output level telemetry. In a reduced to practice embodiment of the linearizer 30, the third commandable gain block 32 provides for a 7.5 dB commandable output power range with 0.5 dB step size. The linearizer bridge 31 comprises a phase shifter 34, a distortion generator 35, a bridge circuit attenuator 36 and a delay line 37. The linearizer bridge 31 is substantially similar to a linearizer bridge disclosed in U.S. Pat. No. 5,789,978 assigned to the assignee of the present invention. The contents of this patent are incorporated herein by reference in its entirety. The linearizer bridge 31 may be realized on a compact size, single alumina substrate using PIN and Schottky diodes or using MMIC chips to minimize production cost.

The linearizer 30 alters the output of the channel amplifier 20 by adding gain expansion and phase advance (or lag) as a function of power level to offset the gain compression and phase lag (or advance) of the high power amplifier up to and beyond saturation. The command functions of the linearizer 30 include active and bypass mode selection, commandable output power level and output power limiting capability. The command functions are controlled by the control circuit 40 and will be described in detail below.

The control circuit 40 comprises a number of analog and digital integrated circuits (shown in detail in FIG. 2) that provide regulated voltage supplies for circuits of the linearized channel amplifier 10. The control circuit 40 also provides separate temperature compensated currents to control the attenuators 23 in the channel amplifier 20 and the output attenuator 23 of the linearizer 30, as well as control currents for the phase shifter 34, the distortion generator 35 and the bridge circuit attenuator 36.

A reduced to practice embodiment of the control circuit 40 provides power and control paths that provide ±5 volt DC power and ground to the channel amplifier 20 and the linearizer 30. A first channel amplifier control path 81 for the channel amplifier 20 provides 1 dB/step attenuation control and gain temperature compensation. A second channel amplifier control path 82 for the channel amplifier 20 provides 0.5 dB/step attenuation control and output level temperature compensation.

The control circuit 40 has control paths that provide for control over the linearizer 30. A distortion control path 83 provides for distortion control of the linearizer 30. A phase control path 84 provides for phase control of the linearizer 30. An attenuation control path 85 provides for attenuation control of the linearizer 30. A limiting control path 86 provides for limiting control of the linearizer 30. An attenuation and temperature compensation control path 87 provides for 0.5 dB/step attenuation control and temperature compensation the linearizer 30.

A number of sensor output signals are output by way of the control circuit 40. An output signal from an ALC level detector (detector/coupler 26) is output by the control circuit 40 by way of path 91. A signal from an output level detector (detector/coupler 27) in the channel amplifier 20 is output by the control circuit 40 by way of path 92. A diode voltage signal from a temperature sensor in the third commandable gain block 32 is output by the control circuit 40 by way of a temperature sensor path 93. A signal from an output level detector (detector/coupler 27) in the linearizer 30 is output by the control circuit 40 by way of path 94.

Figure 2:
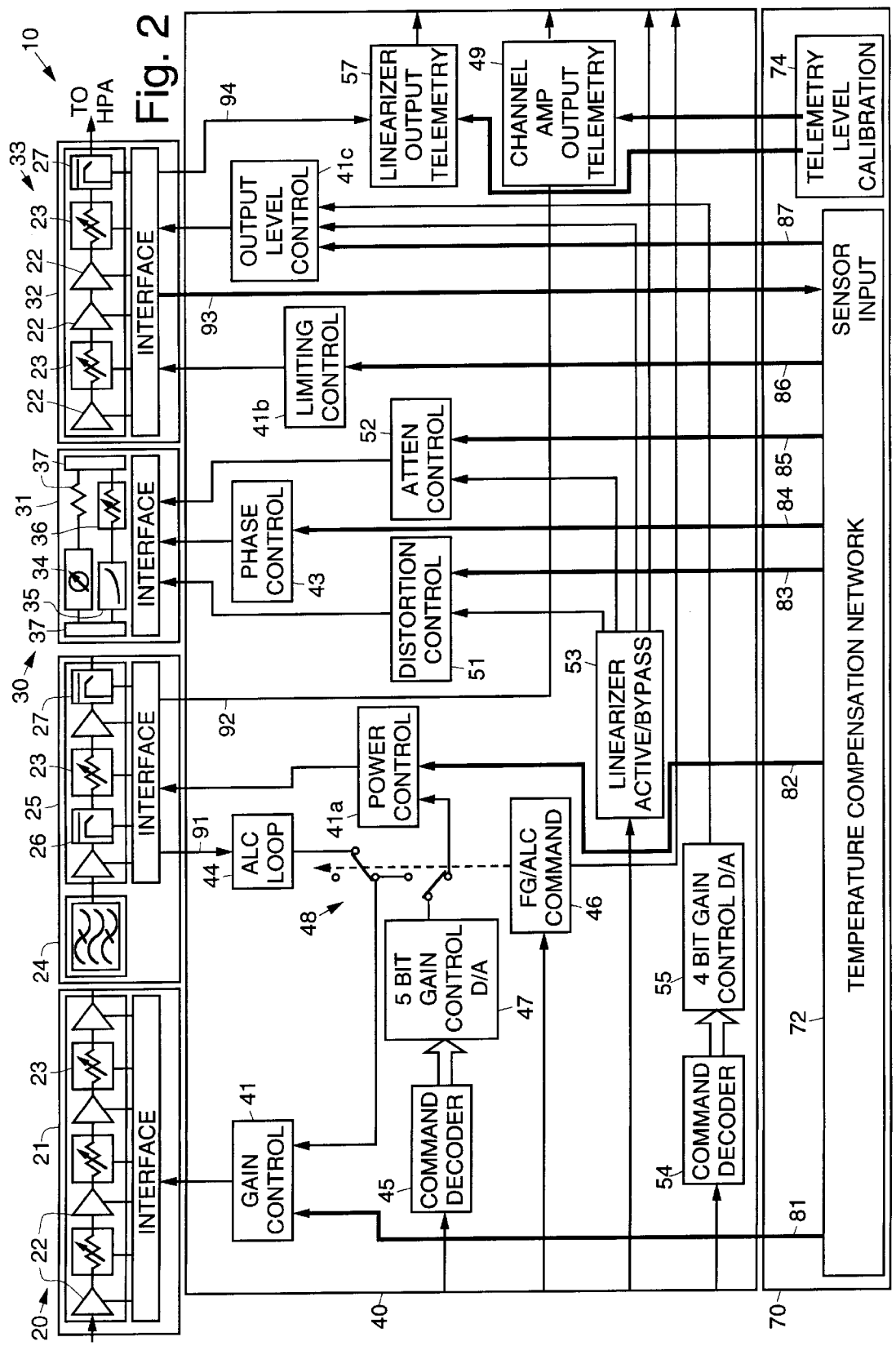
FIG. 2 is a block diagram that illustrates details of the control circuit and personality plug employed in the exemplary linearized channel amplifier FIG. 1.

FIG. 2 is a block diagram showing details of the control circuit 40 and personality plug 70 of the exemplary linearized channel amplifier 10 shown in FIG. 1. The control circuit 40 comprises analog and digital integrated circuits that provide regulated voltage supplies for circuits of the linearized channel amplifier 10. The control circuit 40 also provides separate temperature compensated currents to control the attenuators 23 in the channel amplifier 20 and the output attenuator 23 of the linearizer 30, as well as control currents for the phase shifter 34, the distortion generator 35 and the bridge circuit attenuator 36. The personality plug 70 includes a temperature compensation network 72 and a telemetry level calibration circuit 74 as shown in FIG. 2.

A gain control circuit 41 combines a temperature compensation signal output by the temperature compensation network 72 through path 81 and a gain command signal from either an ALC loop 44 or the 5 bit gain control D/A 47 as determined by the switches 48. The 5 bit gain control D/A 47 receives commands from a command decoder 45. The switches 48 receive commands from a FG/ALC command circuit 46. The gain control circuit 41 outputs gain control signals that provide for fixed gain (FG) and ALC mode selection that are applied to the first commandable gain block 21.

A power control circuit 41a combines a temperature compensation signal from temperature compensation network 72 received by way of the second channel amplifier control path 82 and a power command signal from the 5 bit gain control D/A 47 received by way of the switches 48. The power control circuit 41a outputs power control signals that are applied to the second commandable gain block 25.

A distortion control circuit 51 combines the temperature compensation signal from the temperature compensation network 72 received by way of the distortion control path 83 and a signal from a linearizer active/bypass command circuit 53 to produce a distortion control signal that is applied to the linearizer bridge 31. A phase control circuit 43 receives the temperature compensation signal from the temperature compensation network 72 by way of the phase control path 84 and outputs a phase control signal that is applied to the linearizer bridge 31. An attenuator control circuit 52 combines the temperature compensation signal from the temperature compensation network 72 received by way of the attenuation control path 85 and a signal from the linearizer active/bypass command circuit 53 and outputs an attenuation control signal that is applied to the linearizer bridge 31.

A limiting control circuit 41b receives the temperature compensation signal from the temperature compensation network 72 by way of the limiting control path 86 and outputs a limiting control signal that is applied to the third commandable gain block 32. A 4 bit gain control D/A 55 receives commands from a command decoder 54 and outputs a command signal. An output level control circuit 41c combines three signals, including the temperature compensation signal from the temperature compensation network 72 received by way of the attenuation and temperature compensation control path 87, a linearizer active/bypsss command output by the linearizer active/bypsss command circuit 53 and the command signal output by the 4 bit gain control D/A 55. The output level control circuit 41c outputs an output level control signal that is applied to the third commandable gain block 32.

The voltage of the temperature sensor in the third commandable gain block 32 is input into the temperature compensation network 72 through the temperature sensor path 93. This temperature sensor input is distributed inside the temperature compensation network 72 and controls temperature compensation signal requirements of paths 81, 82, 83, 84, 85, 86 and 87.

The channel amplifier output telemetry circuit 49 receives a detector signal from the detector/coupler 27 in the second commandable gain block 25 and converts it to a proper output voltage using a telemetry level calibration circuit 74. A linearizer output telemetry circuit 57 receives a detector signal from the detector/coupler 27 in the third commandable gain block 32 and converts it to a proper output voltage using the telemetry level calibration circuit 74.

The control circuit 40 uses a novel analytical methodology to set proper controls for the linearized channel amplifier 10. The use of the control circuit 40 eliminates a time consuming tune and test process of a predecessor linearized channel amplifier developed by the assignee of the present invention. The manner in which the controls for the linearized channel amplifier 10 are implemented is as follows.

The novel analytical methodology sets the proper controls for the linearized channel amplifier 10 is as follows. The setting methodology for the temperature compensation network 72 depends on the measured RF performance of linearized channel amplifier 10. The measurement includes two settings and three measurements using either the signal generator 13 or the network analyzer 15 as shown in FIG. 1.

The first measurement determines channel amplifier level settings over temperature using the signal generator 13 and detector voltages from the detector/couplers 26, 27 in the second commandable gain block 25 through paths 91 and 92. This measurement determines the channel amplifier control voltage requirement over temperature through paths 81 and 82.

The second measurement determines linearizer gain and phase settings over temperature using the network analyzer 15 and an input 20 dB attenuator 16. This measurement determines the proper linearizer control voltage requirement over temperature through paths 83, 84 and 85.

The third measurement determines the linearizer output level setting over temperature using the signal generator 13 and the power meter 14. This measurement determines the proper linearizer control voltage requeiment over temperature through paths 86 and 87.

Based on the measured requirement control voltages over temperature through paths 81, 82, 83, 84, 85, 86, 87 as described above and measured diode sensor voltage over temperature through path 93, the resistor values in the temperature compensation network 72 may be calculated analytically.

Based on the measured detector voltages from the detector/coupler 27 in the second and third commandable gain blocks 25, 32 through paths 92 and 94, the resistor values in the telemetry level calibration circuit 74 may be analytically calculated. The proper resistor values are selected in the temperature compensation network 72 and in the telemetry level calibration circuit 74 which are located inside the personality plug 70. The linearized channel amplifier module (including circuits 10, 40 and 70) perform according the specifications over temperature when the personality plug 70 is connected through the control circuit 40 to command and control the linearized channel amplifier 10.

The settings for components of the control circuit 40 (temperature compensation network 72 and telemetry level calibration circuit 74) may be accomplished using a personality circuit containing internal resistors disposed in the control circuit 40 or using the external configurable personality plug 70 containing the resistors in the temperature compensation network 72 and telemetry level calibration circuit 74.

FIG. 2 illustrates circuit blocks of the configurable personality plug 70. The configurable personality plug 70 comprises temperature compensation resistors contained in the temperature compensation network 72. The configurable personality plug 70 also comprises resistors contained in the telemetry level calibration circuit 74.

The linearized channel amplifier 10 may be used in any frequency band including L, C, X, Ku, K, Ka, Q, V, W, etc. bands. The linearized channel amplifier 10 may be used with any high power amplifier, including traveling wave tube amplifiers (TWTA) and solid state power amplifiers (SSPA).

Thus, an improved low cost linearized channel amplifier designed for use with high power amplifiers has been disclosed. It is to be understood that the described embodiment is merely illustrative of some of the many specific embodiments that represent applications of the principles of the present invention. Clearly, numerous and other arrangements can be readily devised by those skilled in the art without departing from the scope of the invention.

What is claimed is:

1. A linearized channel amplifier for use in driving a high power amplifier, comprising:
    a channel amplifier comprising a first commandable gain block, a bandpass filter, a second commandable gain block having a detector/coupler for outputting automatic gain level control to an automatic gain level control loop, and a detector/coupler that provides for output level telemetry;
    a linearizer coupled to the channel amplifier comprising a linearizer bridge coupled to a third commandable gain block; and
    a control circuit coupled to the channel amplifier and the linearizer that provides regulated voltages thereto and provides temperature compensated currents to control attenuators in the channel amplifier and an output attenuator of the linearizer, and control currents for a phase shifter, a distortion generator and a bridge circuit attenuator, which control circuit comprises a gain control circuit and power control circuit that is coupled to the first and second commandable gain blocks.

2. The linearized channel amplifier recited in claim 1 wherein the second commandable gain block comprises an attenuator that provides for commandable automatic gain level control operation.

3. The linearized channel amplifier recited in claim 1 wherein the first commandable gain block comprises a MMIC amplifier and attenuator.

4. The linearized channel amplifier recited in claim 3 wherein the attenuator provides a 30 dB range in 1 dB step size.

5. The linearized channel amplifier recited in claim 1 wherein the third commandable gain block comprises a limiting amplifier and a detector/coupler that provides for output level telemetry.

6. The linearized channel amplifier recited in claim 5 wherein the limiting amplifier comprises an amplifier and an attenuator.

7. The linearized channel amplifier recited in claim 1 wherein the linearizer bridge comprises a phase shifter, a distortion generator, a bridge circuit attenuator and a delay line.

8. The linearized channel amplifier recited in claim 1 wherein the control circuit further comprises a phase control circuit, a distortion control circuit and an attenuation control circuit that are controlled using externally generated and supplied gain expansion and phase leading tuning signals applied thereto.

9. The linearized channel amplifier recited in claim 1 wherein an output level control circuit is coupled to the third commandable gain block and is selectively controlled by means of a command decoder that is coupled by way of a 4-bit gain control digital to analog converter.

10. The linearized channel amplifier recited in claim 1 wherein commands and telemetry of the linearized channel amplifier are controlled either through pulse commands or serial interface adapter commands that are respectively input by way of the command decoder.

11. The linearized channel amplifier recited in claim 1 further comprising a linearizer bypass circuit coupled to a distortion control circuit and an attenuation control circuit that receives a signal that turns the circuits off so that there is no gain expansion or phase advance.

12. The linearized channel amplifier recited in claim 1 wherein the control circuit comprises an analytical methodology to set controls for the linearized channel amplifier.

13. The linearized channel amplifier recited in claim 1 further comprising an external configurable personality plug comprising a temperature compensation network and a telemetry level calibration circuit that contain resistors that control the settings of components of the control circuit.

14. The linearized channel amplifier recited in claim 1 wherein the control circuit controls the settings of components of the control circuit.

15. The linearized channel amplifier recited in claim 1 that is designed to operate in a frequency band selected from the group including the L, C, X, Ku, K, Ka, Q, V, and W, frequency bands.

16. The linearized channel amplifier recited in claim 1 wherein the high power amplifier, comprises a traveling wave tube amplifier.

17. The linearized channel amplifier recited in claim 1 wherein the high power amplifier, comprises a solid state power amplifiers.

18. The linearized channel amplifier recited in claim 1 wherein the detector/coupler couples automatic gain level control signals by way of an ALC loop and a commandable switch to the gain control circuit.

19. The linearized channel amplifier recited in claim 1 wherein command functions of channel amplifier include fixed gain and automatic gain level control mode selection, and commandable gain or power level.

20. The linearized channel amplifier recited in claim 1 wherein command functions of the linearizer include active and bypass mode selection, commandable output power level, and output power limiting capability.

* * * * *